United States Patent
Philip, Jr. et al.

(10) Patent No.: US 8,957,315 B2
(45) Date of Patent: Feb. 17, 2015

(54) STABILIZATION AGENTS FOR SILVER NANOWIRE BASED TRANSPARENT CONDUCTIVE FILMS

(71) Applicant: Carestream Health, Inc., Rochester, NY (US)

(72) Inventors: James B. Philip, Jr., Fort Myers, FL (US); Chaofeng Zou, Maplewood, MN (US)

(73) Assignee: Carestream Health, Inc., Rochester, NY (US)

( * ) Notice: Subject to any disclaimer, the term of this patent is extended or adjusted under 35 U.S.C. 154(b) by 0 days.

(21) Appl. No.: 14/182,311

(22) Filed: Feb. 18, 2014

(65) Prior Publication Data

US 2014/0251655 A1    Sep. 11, 2014

Related U.S. Application Data

(60) Provisional application No. 61/776,057, filed on Mar. 11, 2013.

(51) Int. Cl.
| | |
|---|---|
| *H05K 1/09* | (2006.01) |
| *H05K 3/46* | (2006.01) |
| *H05K 1/03* | (2006.01) |
| *H01B 1/22* | (2006.01) |

(52) U.S. Cl.
CPC .. *H05K 1/09* (2013.01); *H05K 1/03* (2013.01); *H05K 3/4644* (2013.01); *H01B 1/22* (2013.01)
USPC ............................ 174/251; 174/255; 174/256

(58) Field of Classification Search
CPC .......... H05K 1/09; H05K 1/03; H05K 3/4644
USPC .......................... 174/250, 251, 255, 256, 257
See application file for complete search history.

(56) References Cited

U.S. PATENT DOCUMENTS

| | | | |
|---|---|---|---|
| 8,049,333 B2 | 11/2011 | Alden et al. | |
| 8,052,773 B2 | 11/2011 | Takada | |
| 2006/0257638 A1 | 11/2006 | Glatkowski et al. | |
| 2008/0286447 A1 | 11/2008 | Alden et al. | |
| 2008/0292979 A1 | 11/2008 | Ding et al. | |
| 2010/0307792 A1 | 12/2010 | Allemand et al. | |
| 2011/0024159 A1* | 2/2011 | Allemand et al. | 174/126.1 |
| 2012/0063948 A1 | 3/2012 | Ramsden et al. | |
| 2012/0148436 A1 | 6/2012 | Whitcomb et al. | |
| 2012/0207644 A1 | 8/2012 | Ollmann et al. | |
| 2012/0216181 A1 | 8/2012 | Arcese et al. | |
| 2012/0328469 A1 | 12/2012 | Zhang et al. | |
| 2014/0048131 A1* | 2/2014 | Tanaka et al. | 136/256 |

FOREIGN PATENT DOCUMENTS

| | | |
|---|---|---|
| EP | 2 251 389 | 8/2012 |
| WO | 2011/115603 | 9/2011 |
| WO | 2012/147955 | 11/2012 |

OTHER PUBLICATIONS

C. Ducamp-Sanguesa et al., "Synthesis and Characterization of Fine and Monodisperse Silver Particles of Uniform Shape, " Journal of Solid State Chemistry, 100, pp. 272-280, 1992.
Yugang Sun et al., "Uniform Silver Nanowires Synthesis by Reducing AgNO3 with Ethylene Glycol in The Presence of Seeds and Poly(Vinyl Pyrrolidone)," Chem. Mater., 2002, 14, pp. 4736-4745.
Yugang Sun et al., "Polyol Synthesis of Uniform Silver Nanowires: A Plausible Growth Mechanism and the Supporting Evidence," 2003 American Chemical Society, Nanoletters, 3(7), pp. 955-960.
International Search Report for International Application No. PCT/US2014/017235 mailed on May 28, 2014, 4 pages.

* cited by examiner

*Primary Examiner* — Timothy Thompson
*Assistant Examiner* — Amol Patel
(74) *Attorney, Agent, or Firm* — Reed L. Christiansen

(57) ABSTRACT

Boric acid has been found to provide anticorrosion properties when incorporated into silver nanowire containing films. Such compounds may be incorporated into one or more silver nanowire containing layers or in one or more layers disposed adjacent to the silver nanowire containing layers.

11 Claims, No Drawings

STABILIZATION AGENTS FOR SILVER NANOWIRE BASED TRANSPARENT CONDUCTIVE FILMS

CROSS-REFERENCE TO RELATED APPLICATIONS

This application claims the benefit of U.S. Provisional Application No. 61/776,057, filed Mar. 11, 2013, entitled STABILIZATION AGENTS FOR SILVER NANOWIRE BASED TRANSPARENT CONDUCTIVE FILMS, which is hereby incorporated by reference in its entirety.

BACKGROUND

Transparent and conductive films (TCF) have been used extensively in recent years in applications such as touch panel displays, liquid crystal displays, electroluminescent lighting, organic light-emitting diode devices, and photovoltaic solar cells. Indium tin oxide (ITO) based transparent conductive film has been the transparent conductor-of-choice for most applications due to its high conductivity, transparency, and relatively good stability. However, indium tin oxide based transparent conductive films have limitations due to the high cost of indium, the need for complicated and expensive vacuum deposition equipment and processes, and indium tin oxide's inherent brittleness and tendency to crack, especially when it is deposited on flexible substrates.

Two of the most important parameters for measuring the properties of transparent conductive films are total light transmittance (% T) and film surface electric conductivity. Higher light transmittance allows clear picture quality for display applications, higher efficiency for lighting and solar energy conversion applications. Lower resistivity (R) is most desirable for most transparent conductive films applications in which power consumption can be minimized Therefore, the higher the T/R ratio of the transparent conductive films is, the better the transparent conductive films are.

U.S. Patent Application Publication 2006/0257638A1 discloses a transparent conductive film comprising carbon nanotubes (CNT) and vinyl chloride resin polymer binder.

U.S. Pat. No. 8,049,333 and U.S. Patent Application Publication 2008/0286447A1 disclose a transparent conductive film in which silver nanowires are deposited onto a substrate to form a bare nanowire network followed by overcoating the silver nanowire network with a polymer matrix material to form a transparent conductive film. Polymers such as polyacrylates and carboxyl alkyl cellulose ether polymers were suggested as useful materials for the matrix.

US Patent Application Publication 2008/0286447A1 discloses the use of aromatic triazoles and other nitrogen containing compounds as corrosion inhibitors for silver nanowire based transparent conductors. Long chain alkylthio compounds have also been disclosed as useful corrosion inhibitors.

U.S. Patent Application Publication 2008/0292979A1 discloses a transparent conductive film comprising silver nanowires, or a mixture of silver nanowires and carbon nanotubes. The transparent conductive network is formed either without polymer binder or in a photoimageable composition. The transparent conductive films were coated on both glass and polyethylene terephthalate (PET) supports.

U.S. Pat. No. 8,052,773 describes a transparent conductive film which is formed from coating of silver nanowires to form a network followed by overcoating with a layer of urethane acrylate polymer.

U.S. Patent Application Publication 2011/0024159A1 discloses use of corrosion inhibitors in an overcoat layer of a transparent conductive film.

PCT Patent Publication WO 2011/115603 discloses anti-corrosion agents comprising 1,2-diazine compounds for use in transparent conductive films.

US Patent Application Publication 2010/0307792A1 discloses addition of coordination ligands with silver nanowire aqueous dispersions to form sediments followed by separation of such sediments from the supernatant containing halide ions before applying such silver nanowire dispersions in the coating and formation of TCF.

European Patent EP2251389B1 discloses a silver nanowire based ink formulation in which various aqueous silver complex ions were added into silver nanowire based ink in a ratio of complex ion to silver nanowire of no more than 1:64 (w:w).

SUMMARY

Boric acid is particularly useful as an anticorrosion agent for the stabilization of a network of silver nanowire-based transparent conductive films toward the undesirable reaction of such conductive films with corrosive agents such as hydrogen sulfide.

We have discovered that the effectiveness of boric acid may be enhanced by its introduction in at least one coating mix for at least one layer disposed adjacent to the at least one layer comprising silver nanowires. Such a layer might be an overcoat or topcoat layer, if disposed on the at least one layer comprising silver nanowires. Such an overcoat or topcoat layer may, for example, be thermally cured or UV cured. Alternatively, such a layer might be a primer or undercoat layer, if disposed between the at least one layer comprising silver nanowires and the transparent support. Or the boric acid might be included in layers both above and below the at least one layer comprising silver nanowires. In any of these cases, the boric acid may, optionally, also be added to at least one of the layers comprising silver nanowires.

At least a first embodiment provides a transparent conductive article comprising a transparent support; at least one first layer disposed on the transparent support, the at least one first layer comprising a network of silver nanowires dispersed within a polymer binder; and at least one second layer disposed on the at least one first layer, the at least one second layer comprising boric acid.

In at least some embodiments, the at least one second layer may further comprise at least one mercaptotetrazole or mercaptotriazole.

In at least some embodiments, the at least one mercaptotetrazole comprises at least one compound having the general structure (I):

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$). An exemplary mercaptotetrazole is 1-phenyl-1H-tetrazole-5-thiol, which has the structure (II):

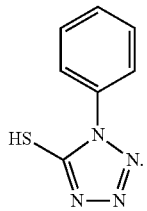

(II)

In at least some such embodiments, the at least one mercaptotriazole comprises at least one 1,2,4-mercaptotriazole.

In at least some such embodiments, the at least one mercaptotriazole comprises at least one compound having the general structure (III):

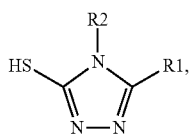

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$). Exemplary mercaptotriazoles are 4-benzyl-1,2,4-triazole-3-thiol, having structure (IV):

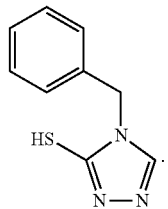

(IV)

and 4-benzyl-5-hydroxymethyl-1,2,4-triazole-3-thiol, having structure (V):

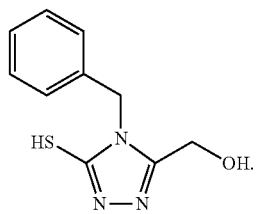

(V)

In at least some such embodiments, the at least one first layer may further comprise boric acid.

Or, in some cases, the at least one first layer may further comprise boric acid and at least one mercaptotetrazole or mercaptotriazole as described above.

At least a second embodiment provides a transparent conductive article comprising a transparent support; at least one first layer disposed on the transparent support, the at least one first layer comprising boric acid; and at least one second layer disposed on the at least one first layer, the at least one second layer comprising a network of silver nanowires dispersed within a polymer binder.

In at least some such embodiments, the at least one first layer may further comprise at least one mercaptotetrazole or mercaptotriazole as described above.

In at least some such embodiments, the at least one second layer may further comprise boric acid.

Or, in some cases, the at least one second layer may further comprise boric acid and at least one mercaptotetrazole or mercaptotriazole as described above.

At least a third embodiment provides a transparent conductive article comprising a transparent support; at least one first layer disposed on the transparent support; at least one second layer disposed on the at least one first layer, the at least one second layer comprising a network of silver nanowires dispersed within a polymer binder; at least one third layer disposed on the at least one second layer, the at least one third layer comprising boric acid.

In at least some embodiments, the at least one third layer may further comprise at least one mercaptotetrazole or mercaptotriazole as described above.

In at least some such embodiments, the at least one second layer may further comprise boric acid.

Or, in some cases, the at least one second layer may further comprise boric acid and at least one mercaptotriazole or mercaptotriazole as described above.

At least a fourth embodiment provides methods comprising applying at least one first coating mixture onto a transparent support to form at least one first coated layer, the at least one first coating mixture comprising silver nanowires and at least one polymer binder; and applying at least one second coating mixture onto the at least one first coated layer to form at least one second coated layer, the at least one second coating mixture comprising boric acid.

In at least some such embodiments, the at least one second coating mixture may further comprise at least one mercaptotetrazole or mercaptotriazole as described above.

In at least some such embodiments, the at least one first coating mixture may further comprise boric acid.

Or, in some cases, the at least one first coating mixture may further comprise boric acid and at least one mercaptotetrazole or mercaptotriazole as described above.

At least a fifth embodiment provides methods comprising applying at least one first coating mixture onto a transparent support to form at least one first coated layer, the at least one first coating mixture comprising boric acid, and applying at least one second coating mixture onto the at least one first coated layer, the at least one second coating mixture comprising silver nanowires and at least one polymer binder.

In at least some such embodiments, the at least one first coating mixture may further comprise at least one mercaptotetrazole or mercaptotriazole as described above.

In at least some such embodiments, the at least one second coating mixture may further comprise boric acid.

Or, in some cases, the at least one first coating mixture may further comprise boric acid and at least one mercaptotetrazole or mercaptotriazole as described above.

DESCRIPTION

All publications, patents, and patent documents referred to in this document are incorporated by reference in their entirety, as though individually incorporated by reference.

U.S. Provisional Application No. 61/776,057, filed Mar. 11, 2013, entitled STABILIZATION AGENTS FOR SILVER NANOWIRE BASED TRANSPARENT CONDUCTIVE FILMS, is hereby incorporated by reference in its entirety.
Definitions:

The terms "conductive layer" or "conductive film" refer to the network layer comprising silver nanowires dispersed within a polymer binder.

The term "conductive" refers to electrical conductivity.

The term "article" refers to the coating of a "conductive layer" or "conductive film" on a support.

The terms "coating weight," "coat weight," and "coverage" are synonymous, and are usually expressed in weight or moles per unit area such as $g/m^2$ or $mol/m^2$.

The term "transparent" means capable of transmitting visible light without appreciable scattering or absorption.

"Haze" is wide-angle scattering that diffuses light uniformly in all directions. It is the percentage of transmitted light that deviates from the incident beam by more than 2.5 degrees on the average. Haze reduces contrast and results in a milky or cloudy appearance. Materials having lower haze percentages appear less hazy than those having higher haze percentages.

The term "organic solvent" means "a material, liquid at use temperature, whose chemical formula comprises one or more carbon atoms."

The term "aqueous solvent" means a material, liquid at use temperature, whose composition in a homogeneous solution comprises water in the greatest proportion (i.e., at least 50 per cent water by weight).

The term "water soluble" means the solute forms a homogenous solution with water, or a solvent mixture in which water is the major component.

The terms "a" or "an" refer to "at least one" of that component (for example, the anticorrosion agents, nanowires, and polymers described herein).

Furthermore, all publications, patents, and patent documents referred to in this document are incorporated by reference herein in their entirety, as though individually incorporated by reference.
Introduction In order for silver based transparent conductors to have practical use it is important that these silver based transparent conductors be stable for a long period when subjected to environmental conditions.

Any atmospheric corrosion due to the reaction of low levels of chemicals in the air may induce undesirable chemical reactions at the metal nanowire surface, impacting the conductivity and performance of the metal nanowire based transparent conductors. It is well known that corrosion, or "tarnishing," may readily occur on silver metal surfaces when exposed to the atmosphere. Without wishing to be bound by theory, one example of such a tarnishing mechanism is sulfidation of silver surface by reaction of hydrogen sulfide with silver:

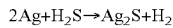

$$2Ag + H_2S \rightarrow Ag_2S + H_2$$

Because the electric conductivity of silver compounds such as silver sulfide is much lower than that of silver metal, silver nanowire based conductors can gradually lose conductivity when exposed to the atmosphere.

In contrast to bare metal wires exposed to the air, silver nanowires in a polymer matrix are more stable since the presence of the polymer slows down the diffusion of hydrogen sulfide (or other corrosive agents) to the silver nanowire surface. Nevertheless, it is important to stabilize the silver nanowire surface to prevent the sulfidation process, even when the nanowires are embedded in a polymer matrix.

It would be useful to find anticorrosion agents for transparent electrically conductive films comprising a network of silver nanowires in polymer binder(s) that can be coated from aqueous or from organic solvents, using common coating techniques.
Silver Nanowires The silver nanowires are an essential component for imparting electrical conductivity to the conductive films, and to the articles prepared using the conductive films. The electrical conductivity of the transparent conductive film is mainly controlled by a) the conductivity of a single nanowire, b) the number of nanowires between the terminals, and c) the number of connections and the contact resistivity between the nanowires. Below a certain nanowire concentration (also referred as the percolation threshold), the conductivity between the terminals is zero, as there is no continuous current path provided because the nanowires are spaced too far apart. Above this concentration, there is at least one current path available. As more current paths are provided, the overall resistance of the layer will decrease. However, as more current paths are provided, the clarity (i.e., percent light transmission) of the conductive film decreases due to light absorption and back scattering by the nanowires. Also, as the amount of silver nanowires in the conductive film increases, the haze of the transparent film increases due to light scattering by the silver nanowires. Similar effects will occur in transparent articles prepared using the conductive films.

In one embodiment, the silver nanowires have aspect ratio (length/width) of from about 20 to about 3300. In another embodiment, the silver nanowires have an aspect ratio (length/width) of from about 500 to 1000. Silver nanowires having a length of from about 5 μm to about 100 μm (micrometer) and a width of from about 10 nm to about 200 nm are useful. Silver nanowires having a width of from about 20 nm to about 100 nm and a length of from about 10 μm to about 50 μm are also particularly useful for construction of a transparent conductive network film.

Silver nanowires can be prepared by known methods in the art. In particular, silver nanowires can be synthesized through solution-phase reduction of a silver salt (e.g., silver nitrate) in the presence of a polyol (e.g., ethylene glycol or propylene glycol) and poly(vinyl pyrrolidone). Large-scale production of silver nanowires of uniform size can be prepared according to the methods described in, e.g., Ducamp-Sanguesa, C. et al., J. of Solid State Chemistry, (1992), 100, 272-280; Xia, Y. et al., Chem. Mater. (2002), 14, 4736-4745, Xia, Y. et al., Nano Letters, (2003), 3(7), 955-960; US patent application publication 2012/0063948, published Mar. 15, 2012; US patent application publication 2012/0126181, published May 24, 2012; US patent application publication 2012/0148436, published Jun. 14, 2012; US patent application publication 2012/0207644, published Aug. 16, 2012; and US patent application publication 2012/0328469, published Dec. 27, 2012, each of which is incorporated by reference in its entirety.

Polymer Binders

For a practical manufacturing process for transparent conductive films, it is important to have both the conductive components, such as silver nanowires, and a polymer binder in a coating dispersion. The polymer binder solution serves a dual role, as dispersant to facilitate the dispersion of silver nanowires and as a viscosifier to stabilize the silver nanowire coating dispersion so that the sedimentation of silver nanowires does not occur at any point during the coating process. It is also desirable to have the silver nanowires and the polymer binder in a single coating dispersion. This simplifies the coating process and allows for a one-pass coating, and avoids the method of first coating bare silver nanowires to form a weak and fragile film that is subsequently over-coated with a polymer to form the transparent conductive film.

In order for a transparent conductive film to be useful in various device applications, it is also important for the polymer binder of the transparent conductive film to be optically transparent and flexible, yet have high mechanical strength, good hardness, high thermal stability, and light stability. This requires polymer binders to be used for transparent conductive film to have Tg (glass transition temperature) greater than the use temperature of the transparent conductive film.

Transparent, optically clear polymer binders are known in the art. Examples of suitable polymeric binders include, but are not limited to: polyacrylics such as polymethacrylates (e.g., poly(methyl methacrylate)), polyacrylates and polyacrylonitriles, polyvinyl alcohols, polyesters (e.g., polyethylene terephthalate (PET), polybutylene terephthalate, and polyethylene naphthalate), polymers with a high degree of aromaticity such as phenolics or cresol-formaldehyde (e.g., NOVOLAC®), polystyrenes, polyvinyltoluene, polyvinylxylene, polyimides, polyamides, polyamideimides, polyetheramides, polysulfides, polysulfones, polyphenylenes, and polyphenyl ethers, polyurethanes (PU), polycarbonates, epoxy, polyolefins (e.g. polypropylene, polymethylpentene, and cyclic olefins), acrylonitrile-butadiene-styrene copolymer (ABS), cellulosics, silicones and other silicon-containing polymers (e.g. polysilsesquioxanes and polysilanes), polyvinylchloride (PVC), polyvinylacetates, polynorbornenes, synthetic rubbers (e.g. EPR, SBR, EPDM), and fluoropolymers (e.g., polyvinylidene fluoride, polytetrafluoroethylene (TFE) or polyhexafluoropropylene), copolymers of fluoro-olefins and hydrocarbon olefins (e.g., LUMIFLON®), and amorphous fluorocarbon polymers or copolymers (e.g., CYTOP® by Asahi Glass Co., or TEFLON® AF by Du Pont), polyvinylbutryals, polyvinylacetals, gelatins, polysaccharides, and starches.

In certain embodiments, in order to disperse and stabilize silver nanowires in polymeric coating solution, the use of polymer binders having high oxygen content is advantageous. Oxygen-containing groups, such as hydroxyl group and carboxylate groups have a strong affinity for binding to the silver nanowire surface and facilitate the dispersion and stabilization. Many oxygen-rich polymers also have good solubility in the polar organic solvents commonly used to prepare organic solvent-coated materials, while other oxygen-rich polymers have good solubility in water or the aqueous solvent mixtures commonly used to prepare aqueous solvent-coated materials.

In certain embodiments, cellulose ester polymers, such as cellulose acetate butyrate (CAB), cellulose acetate (CA), or cellulose acetate propionate (CAP) are superior to other oxygen-rich polymer binders when used to prepare silver nanowire based transparent conductive films that are coated from organic solvents such as 2-butanone (methyl ethyl ketone, MEK), methyl iso-butyl ketone, acetone, methanol, ethanol, 2-propanol, ethyl acetate, propyl acetate, butyl acetate, or mixtures thereof. Their use results in transparent conductive films in which both the optical light transmittance and electrical conductivity of the coated films are greatly improved. In addition, these cellulose ester polymers have glass transition temperatures of at least 100° C. and provide transparent, flexible films having high mechanical strength, good hardness, high thermal stability, and light stability.

The cellulose ester polymers can be present in from about 40 to about 90 wt % of the dried transparent conductive films. Preferably, they are present in from about 60 to about 85 wt % of the dried films. In some constructions, a mixture of a cellulosic ester polymer and one or more additional polymers may be used. These polymers should be compatible with the cellulosic polymer. By compatible is meant that a mixture comprising at least one cellulosic ester polymer and one or more additional polymers forms a transparent, single phase composition when dried. The additional polymer or polymers can provide further benefits such as promoting adhesion to the support and improving hardness and scratch resistance. As above, total wt % of all polymers is from about 40 to about 95 wt % of the dried transparent conductive films. Preferably, the total weight of all polymers is from about 60 to about 85 wt % of the dried films. Polyester polymers, urethanes, and polyacrylics are examples of additional polymers useful for blending with cellulosic ester polymers.

In other embodiments, water soluble polymer binders can also be used, such as polyvinyl alcohol, gelatin, polyacrylic acid, polyimides. Other water dispersible latex polymers can also be used such as polyacrylates and polymethacrylates containing methyl acrylic acid units. Coating from aqueous solutions benefits the environment and reduces the emission of volatile organic compounds during manufacturing.

The use of water soluble polymers, such as polyvinyl alcohol or gelatin as binders for silver nanowire based transparent conductors results in superior transparent conductive films in which both film transmittance and conductivity are greatly improved. Transparent conductive films prepared using either polyvinyl alcohol or gelatin polymer binders also show excellent clarity, scratch resistance, and hardness when polymer cross linkers are added to the polymer solution. Transparent conductive films prepared according to this invention provide transmittance of at least 80% across entire spectrum range of about 350 nm to about 1100 nm, and surface resistivity of 500 ohm/sq or less.

The transparent conductive articles comprising silver nanowires and water soluble polymer binders also show excellent clarity, high scratch resistance, and hardness. In addition, transparent conductive films prepared using these polymer binders have good adhesion to supports comprising polyethylene terephthalate (PET), poly(methylmethacrylate), polycarbonate, and the like, when an appropriate subbing layer is applied between the support and the conductive layer.

The water soluble polymer binders are present in from about 40 to about 95 wt % of the dried transparent conductive films. Preferably, they are present in from about 60 to about 85 wt % of the dried films.

In some constructions, up to 50 wt % of the gelatin or polyvinyl alcohol polymer binder can be replaced by one or more additional polymers. These polymers should be compatible with the gelatin or polyvinyl alcohol polymer binder. By compatible is meant that the all polymers form a transparent, single phase mixture when dried. The additional polymer or polymers can provide further benefits such as promoting adhesion to the support and improving hardness and scratch resistance. Water soluble acrylic polymers are particularly preferred as additional polymers. Examples of such polymers are polyacrylic acid and polyacrylamides, and copolymers thereof. As above, total wt % of all polymers is from about 50 to about 95 wt % of the dried transparent conductive films. Preferably, the total weight of all polymers is from about 70 to about 85 wt % of the dried films.

If desired, scratch resistance and hardness of the transparent conductive films with these polymer binders to the support can be improved by use of crosslinking agents to crosslink the polymer binders. Isocyanates, alkoxyl silanes, and melamines are examples of typical crosslinking agents for cellulose ester polymers containing free hydroxyl groups. Vinyl sulfones and aldehydes are examples of typical crosslinking agents for gelatin binders.

Stabilization Agents

Stabilization agents are chemical compounds that, when added to the transparent conductive film, improve the stability of the construction with respect to atmospheric corrosion caused by the reaction of oxygen or one or more other chemicals in the atmosphere with one or more components in the film. This reaction results in deterioration of the electric conductivity, optical properties, and/or physical integrity of the film. Stabilization agents should be colorless and odorless when used in the transparent conductive film, and should be stable to the conditions of heat, light, and humidity in the environment where transparent conductive film is used.

However, in practice, many such compounds, when bound to a silver nanowire surface, will drastically reduce the electric conductivity of the resultant conductive film. Apparently, the insulating effect of these compounds prevents electron "flow" at nanowire contact points. Therefore, it is important to identify a class of compounds that will provide anticorrosion protection to transparent conductive film without causing significant reduction in conductivity and other negative effects. Advantageously, delaying introduction of the anticorrosion agents into the conductive nanowire network until after its formation can minimize the destruction of conductive paths in the network.

We have found that boric acid has anti-corrosive and stabilizing effects when incorporated into silver nanowire containing films.

Mercaptotetrazoles, Mercaptotriazoles, and their Tautomers

In at least some embodiments, anticorrosion compounds may comprise boric acid and further comprise mercaptotetrazoles or mercaptotriazoles. It is well known that heterocyclic compounds exist in tautomeric forms. It should be understood that when mercaptotetrazoles or mercaptotriazoles are referred to or claimed in this application, their related tautomeric forms are also included in the reference or claim.

Both annular tautomerism and substituent tautomerism are possible. For example, for the 1,2,4-mercaptotriazoles, at least three annular tautomers are possible:

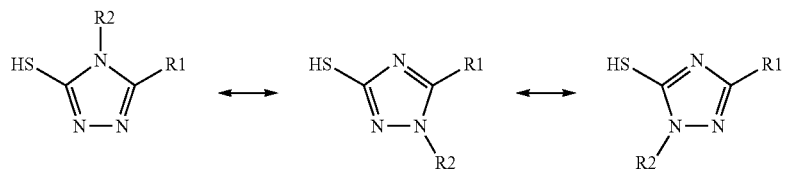

Similarly, for the mercaptotetrazoles, at least four annular tautomers are possible:

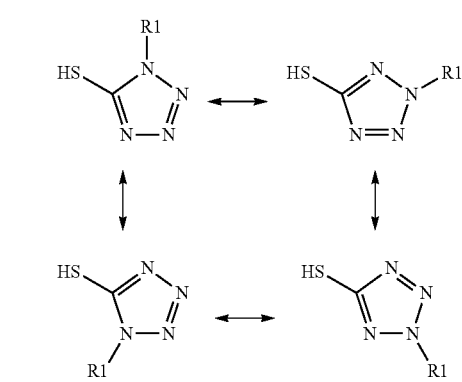

Thiole-thiene substituent tautomerism is also possible, where the labile hydrogen atom from the mercapto functional group becomes bonded to a nitrogen atom in the ring. This is illustrated for both the 1,2,4-mercaptotriazoles and the mercaptotetrazoles:

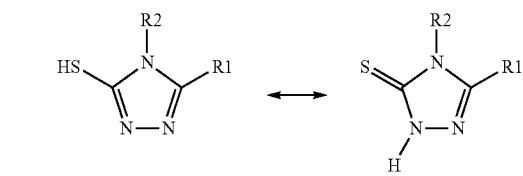

-continued

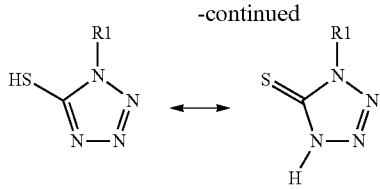

Interconversion among the tautomers can occur rapidly and individual tautomers are generally not isolatable, although particular tautomers may dominate. Accordingly, mercaptotriazoles and mercaptotetrazoles disclosed and claimed in this application will be understood to include their corresponding tautomers, including annular tautomers, substituent tautomers, or a combination of both.

Anticorrosion Agents Comprising Mercaptotetrazoles or Mercaptotriazoles

In at least some embodiments, the anticorrosion compounds may comprise boric acid and further comprise mercaptotetrazoles or mercaptotriazoles. In some cases, the anticorrosion compounds may comprise a mercaptotetrazole with Structure I:

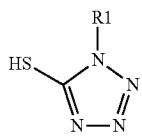

Structure I where R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$). An exemplary mercaptotetrazole is 1-phenyl-1H-tetrazole-5-thiol (PMT), which is shown in Structure II:

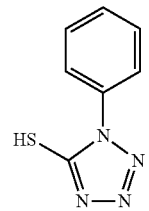

Structure II

In some cases, the anticorrosion compounds may comprise boric acid and further comprise a 1,2,4-mercaptotriazole with Structure III:

Structure III where wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$). Such compounds may be prepared according to the methods of U.S. Pat. No. 6,841,343, which is hereby incorporated by reference in its entirety. Exemplary 1,2,4-mercaptotriazoles are 4-benzyl-1,2,4-triazole-3-thiol (BHTT) with Structure IV:

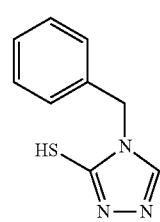

Structure IV and 4-benzyl-5-hydroxymethyl-1,2,4-triazole-3-thiol (BZTT) with Structure V:

Structure V

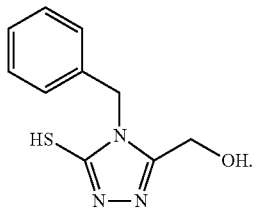

Coating of the Conductive Films

An organic solvent-based coating formulation for the transparent silver nanowire films can be prepared by mixing the various components with one or more polymer binders in a suitable organic solvent system that usually includes one or more solvents such as toluene, 2-butanone (methyl ethyl ketone, MEK), methyl iso-butyl ketone, acetone, methanol, ethanol, 2-propanol, ethyl acetate, propyl acetate, butyl acetate, ethyl lactate, tetrahydrofuran, or mixtures thereof. An aqueous-based coating formulation for the transparent silver nanowire films can be prepared by mixing the various components with one or more polymer binders in water or in a mixture of water with a water miscible solvent such as acetone, acetonitrile, methanol, ethanol, 2-propanol, or tetrahydrofuran, or mixtures thereof. Transparent films containing silver nanowires can be prepared by coating the formulations using various coating procedures such as wire wound rod coating, dip coating, knife or blade coating, curtain coating, slide coating, slot-die coating, roll coating, or gravure coating. Surfactants and other coating aids can be incorporated into the coating formulation.

In one embodiment the coating weight of the silver nanowires is from about 10 mg/m$^2$ to about 500 mg/m$^2$. In another embodiment the coating weight of silver nanowires is from about 20 mg/m$^2$ to about 200 mg/m$^2$. In a further embodiment, the coating weight of silver nanowires is from about 30 mg/m$^2$ to about 120 mg/m$^2$. A useful coating dry thickness of the transparent conductive coating is from about 0.05 µm to about 2.0 µm, and preferably from about 0.1 µm to about 0.5 µm.

Upon coating and drying, the transparent conductive film should have a surface resistivity of less than 1,000 ohms/sq and preferably less than 500 ohm/sq.

Upon coating, and drying, the transparent conductive film should have as high a % transmittance as possible. A transmittance of at least 70% is useful. A transmittance of at least 80% and even at least 90% are even more useful.

Particularly useful are films with a transmittance of at least 70% and a surface resistivity of less than 500 ohm/sq.

Such transparent conductive films provide transmittance of at least 80% across entire spectrum range of from about 350 nm to about 1100 nm, and surface resistivity of less than 500 ohm/sq.

Transparent Support

In one embodiment, the conductive materials are coated onto a support. The support may be rigid or flexible.

Suitable rigid substrates include, for example, glass, polycarbonates, acrylics, and the like.

When the conductive materials are coated onto a flexible support, the support is preferably a flexible, transparent polymeric film that has any desired thickness and is composed of one or more polymeric materials. The support is required to exhibit dimensional stability during coating and drying of the conductive layer and to have suitable adhesive properties with overlying layers. Useful polymeric materials for making such supports include polyesters [such as poly(ethylene terephthalate) (PET) and poly(ethylene naphthalate) (PEN)], cellulose acetates and other cellulose esters, polyvinyl acetal, polyolefins, polycarbonates, and polystyrenes. Preferred supports are composed of polymers having good heat stability, such as polyesters and polycarbonates. Support materials may also be treated or annealed to reduce shrinkage and promote dimensional stability. Transparent multilayer supports can also be used.

Coating of the Conductive Films onto a Support

Transparent conductive articles can be prepared by coating the formulations described above onto a transparent support using various coating procedures such as wire wound rod coating, dip coating, knife coating, curtain coating, slide coating, slot-die coating, roll coating, gravure coating, or extrusion coating.

Alternatively, transparent conductive articles can be prepared by laminating the transparent conductive films prepared as described above onto a transparent support.

In some embodiments, a "carrier" layer formulation comprising a single-phase mixture of two or more polymers may be applied directly onto the support and thereby located between the support and the silver nanowire layer. The carrier layer serves to promote adhesion of the support to the transparent polymer layer containing the silver nanowires. The carrier layer formulation can be sequentially or simultaneously applied with application of the transparent conductive silver nanowire layer formulation. It is preferred that all coating be applied simultaneously onto the support. Carrier layers are often referred to as "adhesion promoting layers," "interlayers," or "intermediate layers".

As noted above, in one embodiment the coating weight of the silver nanowires is from about 20 mg/m$^2$ to about 500 mg/m$^2$. In other embodiments, coating weight of silver nanowires is from about 10 mg/m$^2$ to about 200 mg/m$^2$. Embodiments wherein the silver nanowires are coated at from about 10 mg/m$^2$ to about 120 mg/m$^2$ are also contemplated.

Upon coating and drying, the transparent conductive article should have a surface resistivity of less than 1,000 ohms/sq and preferably less than 500 ohm/sq.

Similarly, upon coating and drying on a transparent support, the transparent conductive article should have as high an optical transmittance as possible. A transmittance of at least 70% is useful. A transmittance of at least 80% and even at least 90% are even more useful.

Particularly preferred are articles with a transmittance of at least 80% and a surface resistivity of less than 500 ohm/sq.

Exemplary Embodiments

U.S. Provisional Application No. 61/776,057, filed Mar. 11, 2013, entitled STABILIZATION AGENTS FOR SILVER NANOWIRE BASED TRANSPARENT CONDUCTIVE FILMS, which is hereby incorporated by reference in its entirety disclosed the following 100 exemplary non-limiting embodiments:

A. A transparent conductive article comprising:
   a transparent support;
   at least one first layer disposed on the transparent support, the at least one first layer comprising a network of silver nanowires dispersed within at least one polymer binder; and;
   at least one second layer disposed on the at least one first layer, the at least one second layer comprising boric acid.

B. The transparent conductive article of embodiment A, wherein the at least one first layer further comprises at least one mercaptotetrazole or mercaptotriazole.

C. The transparent conductive article according to embodiment B, wherein the at least one mercaptotetrazole comprises at least one compound having the general structure (I):

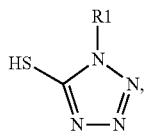

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).

D. The transparent conductive article according to embodiment B, wherein the at least one mercaptotetrazole comprises 1-phenyl-1H-tetrazole-5-thiol.

E. The transparent conductive article according to embodiment B, wherein the at least one mercaptotetrazole comprises at least one compound having the structure (II):

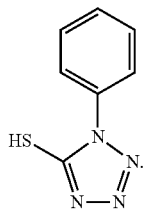

(II)

F. The transparent conductive article according to embodiment B, wherein the at least one mercaptotriazole comprises at least one 1,2,4-mercaptotriazole.

G. The transparent conductive article according to embodiment B, wherein the at least one mercaptotriazole comprises at least one compound having the general structure (III):

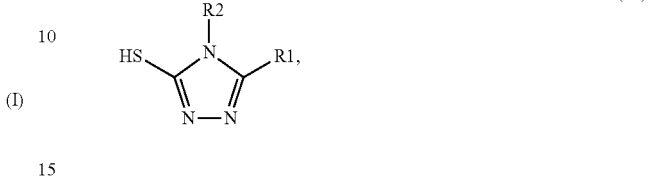

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$).

H. The transparent conductive article according to embodiment B, wherein the at least one mercaptotriazole comprises 4-benzyl-1,2,4-triazole-3-thiol.

J. The transparent conductive article according to embodiment B, wherein the at least one mercaptotriazole comprises at least one compound having the structure (IV):

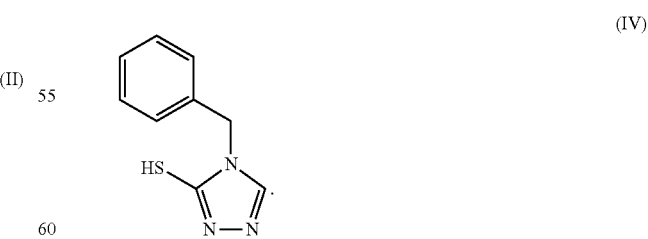

(IV)

K. The transparent conductive article according to embodiment B, wherein the at least one mercaptotriazole comprises 4-benzyl-5-hydroxymethyl-1,2,4-triazole-3-thiol.

L. The transparent conductive article according to embodiment B, wherein the at least one mercaptotriazole comprises at least one compound having the structure (V):

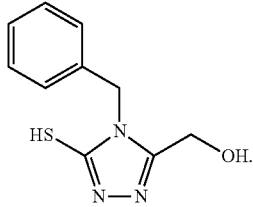

(V)

M. The transparent conductive article of embodiment A, wherein the transparent support is a flexible transparent polymer film.
N. The transparent conductive article of embodiment A, wherein the silver nanowires are present in an amount sufficient to provide a surface resistivity of less than about 1000 ohm/sq.
P. The transparent conductive article of embodiment A, wherein the silver nanowires have an aspect ratio of from about 20 to about 3300.
Q. The transparent conductive article of embodiment A, wherein the silver nanowires are present in an amount of from about 10 $mg/m^2$ to about 500 $mg/m^2$.
R. The transparent conductive article of embodiment A, having a transmittance of at least about 80% across entire spectrum range of from about 350 nm to about 1100 nm and a surface resistivity of 500 ohm/sq or less.
S. The transparent conductive article of embodiment A, wherein the at least one polymer binder comprises at least one water soluble polymer.
T. The transparent conductive article of embodiment S, wherein the at least one water soluble polymer comprises gelatin, polyvinyl alcohol, or mixtures thereof.
U. The transparent conductive article of embodiment T, wherein the at least one polymer binder further comprises up to about 50 wt % of one or more additional water soluble polymers.
V. The transparent conductive article of embodiment U, wherein one or more of the additional water soluble polymers is a polyacrylic polymer.
W. The transparent conductive article of embodiment A, wherein the at least one polymer binder comprises an organic solvent soluble polymer.
X. The transparent conductive article of embodiment W, wherein the organic solvent soluble polymer binder comprises at least one cellulose ester polymer.
Y. The transparent conductive article of embodiment W, wherein the organic solvent soluble polymer binder comprises cellulose acetate, cellulose acetate butyrate, or cellulose acetate propionate, or mixtures thereof.
Z. The transparent conductive article of embodiment X, wherein the at least one cellulose ester polymer has a glass transition temperature of at least about 100° C.
AA. The transparent conductive article of embodiment W, wherein the at least one polymer binder further comprises up to 50 wt % of one or more additional organic solvent soluble polymers.
AB. The transparent conductive article of embodiment AA, wherein the one or more of the additional organic solvent soluble polymers is a polyester polymer.

AC. A transparent conductive article comprising:
a transparent support;
at least one first layer disposed on the transparent support, the at least one first layer comprising a network of silver nanowires, a polymer binder, and boric acid; and,
at least one second layer comprising a transparent polymer.
AD. The transparent conductive article of embodiment AC, wherein the at least one first layer further comprises at least one mercaptotetrazole or mercaptotriazole.
AE. The transparent conductive article according to embodiment AD, wherein the at least one mercaptotetrazole comprises at least one compound having the general structure (I):

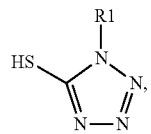

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).
AF. The transparent conductive article according to embodiment AD, wherein the at least one mercaptotetrazole comprises 1-phenyl-1H-tetrazole-5-thiol.
AG. The transparent conductive article according to embodiment AD, wherein the at least one mercaptotetrazole comprises at least one compound having the structure (II):

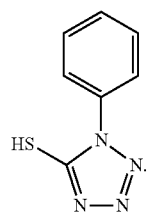

(II)

AH. The transparent conductive article according to embodiment AD, wherein the at least one mercaptotriazole comprises at least one 1,2,4-mercaptotriazole.

AJ. The transparent conductive article according to embodiment AD, wherein the at least one mercaptotriazole comprises at least one compound having the general structure (III):

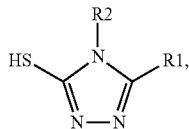

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$).

AK. The transparent conductive article according to embodiment AD, wherein the at least one mercaptotriazole comprises 4-benzyl-1,2,4-triazole-3-thiol.

AL. The transparent conductive article according to embodiment AD, wherein the at least one mercaptotriazole comprises at least one compound having the structure (IV):

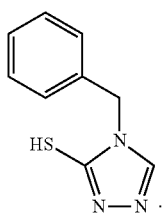

(IV)

AM. The transparent conductive article according to embodiment AD, wherein the at least one mercaptotriazole comprises 4-benzyl-5-hydroxymethyl-1,2,4-triazole-3-thiol.

AN. The transparent conductive article according to embodiment AD, wherein the at least one mercaptotriazole comprises at least one compound having the structure (V):

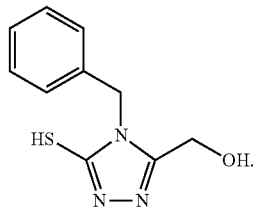

(V)

AP. The transparent conductive article of embodiment AC, wherein the said at least one at least one second layer further comprises at least one mercaptotetrazole or mercaptotriazole.

AQ. The transparent conductive article according to embodiment AP, wherein the at least one mercaptotetrazole comprises at least one compound having the general structure (I):

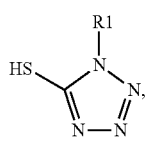

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).

AR. The transparent conductive article according to embodiment AP, wherein the at least one mercaptotetrazole comprises 1-phenyl-1H-tetrazole-5-thiol.

AS. The transparent conductive article according to embodiment AP, wherein the at least one mercaptotetrazole comprises at least one compound having the structure (II):

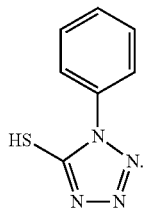

(II)

AT. The transparent conductive article according to embodiment AP, wherein the at least one mercaptotriazole comprises at least one 1,2,4-mercaptotriazole.

AU. The transparent conductive article according to embodiment AD, wherein the at least one mercaptotriazole comprises at least one compound having the general structure (III):

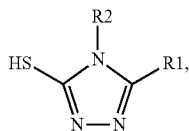

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$).

AV. The transparent conductive article according to embodiment AP, wherein the at least one mercaptotriazole comprises 4-benzyl-1,2,4-triazole-3-thiol.

AW. The transparent conductive article according to embodiment AP, wherein the at least one mercaptotriazole comprises at least one compound having the structure (IV):

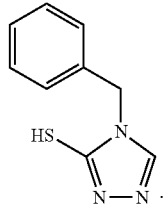

(IV)

AX. The transparent conductive article according to embodiment AP, wherein the at least one mercaptotriazole comprises 4-benzyl-5-hydroxymethyl-1,2,4-triazole-3-thiol.

AY. The transparent conductive article according to embodiment AP, wherein the at least one mercaptotriazole comprises at least one compound having the structure (V):

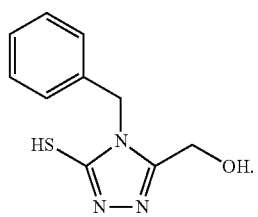

(V)

AZ. The transparent conductive article of embodiment AC, wherein the transparent support is a flexible transparent polymer film.

BA. The transparent conductive article of embodiment AC, wherein the silver nanowires are present in an amount sufficient to provide a surface resistivity of less than about 1000 ohm/sq.

BB. The transparent conductive article of embodiment AC, wherein the silver nanowires have an aspect ratio of from about 20 to about 3300.1

BC. The transparent conductive article of embodiment AC, wherein the silver nanowires are present in an amount of from about 10 $mg/m^2$ to about 500 $mg/m^2$.

BD. The transparent conductive article of embodiment AC, having a transmittance of at least about 80% across entire spectrum range of from about 350 nm to about 1100 nm and a surface resistivity of 500 ohm/sq or less.

BE. The transparent conductive article of embodiment AC, wherein the at least one polymer binder comprises at least one water soluble polymer.

BF. The transparent conductive article of embodiment BE, wherein the at least one water soluble polymer comprises gelatin, polyvinyl alcohol, or mixtures thereof.

BG. The transparent conductive article of embodiment BF, wherein the at least one polymer binder further comprises up to about 50 wt % of one or more additional water soluble polymers.

BH. The transparent conductive article of embodiment BD, wherein one or more of the additional water soluble polymers is a polyacrylic polymer.

BJ. The transparent conductive article of embodiment AC, wherein the at least one polymer binder comprises an organic solvent soluble polymer.

BK. The transparent conductive article of embodiment BJ, wherein the organic solvent soluble polymer binder comprises at least one cellulose ester polymer.
BL. The transparent conductive article of embodiment BJ, wherein the organic solvent soluble polymer binder comprises cellulose acetate, cellulose acetate butyrate, or cellulose acetate propionate, or mixtures thereof.
BM. The transparent conductive article of embodiment BK, wherein the at least one cellulose ester polymer has a glass transition temperature of at least about 100° C.
BN. The transparent conductive article of embodiment AC, wherein the at least one polymer binder further comprises up to 50 wt % of one or more additional organic solvent soluble polymers.
BP. The transparent conductive article of embodiment BN, wherein the one or more of the additional organic solvent soluble polymers is a polyester polymer.
BQ. A method comprising:
applying at least one first coating mixture onto a transparent support to form at least one first coated layer, the at least one first coating mixture comprising silver nanowires and at least one polymer binder; and,
applying at least one second coating mixture onto the at least one first coated layer to form at least one second coated layer, the at least one second coating mixture comprising boric acid.
BR. The method according to embodiment BQ, wherein the said at least one second coating mixture further comprises at least one mercaptotetrazole or mercaptotriazole.
BS. The method according to embodiment BR, wherein the at least one mercaptotetrazole comprises at least one compound having the general structure (I):

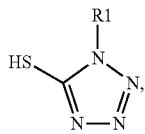

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).
BT. The method according to embodiment BR, wherein the at least one mercaptotetrazole comprises 1-phenyl-1H-tetrazole-5-thiol.

BU. The method according to embodiment BR, wherein the at least one mercaptotetrazole comprises at least one compound having the structure (II):

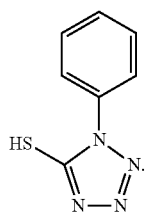

(II)

BV. The method according to embodiment BR, wherein the at least one mercaptotriazole comprises at least one 1,2,4-mercaptotriazole.
BW. The method according to embodiment BR, wherein the at least one mercaptotriazole comprises at least one compound having the general structure (III):

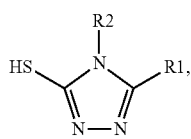

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$).
BX. The method according to embodiment BR, wherein the at least one mercaptotriazole comprises 4-benzyl-1,2,4-triazole-3-thiol.

BY. The method according to embodiment BR, wherein the at least one mercaptotriazole comprises at least one compound having the structure (IV):

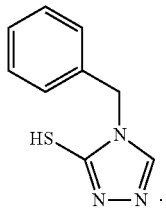

(IV)

BZ. The method according to embodiment BR, wherein the at least one mercaptotriazole comprises 4-benzyl-5-hydroxymethyl-1,2,4-triazole-3-thiol.

CA. The method according to embodiment BR, wherein the at least one mercaptotriazole comprises at least one compound having the structure (V):

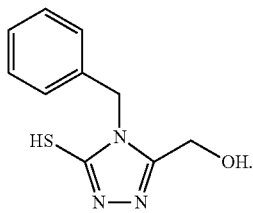

(V)

CB. The method according to embodiment CA, wherein the applying the at least one first coating mixture and the applying the at least one second coating mixture occur simultaneously.

CC. The method according to embodiment CA, further comprising drying the at least one first layer or the at least one second layer or both.

CD. A method comprising:
  applying at least one first coating mixture onto a transparent support to form at least one first coated layer, the at least one first coating mixture comprising boric acid, silver nanowires, and at least one polymer binder; and,
  applying at least one second coating mixture onto the at least one first coated layer.

CE. The method according to embodiment CD, wherein the at least one first coating mixture further comprises at least one mercaptotetrazole or mercaptotriazole.

CF. The method according to embodiment CE, wherein the at least one mercaptotetrazole comprises at least one compound having the general structure (I):

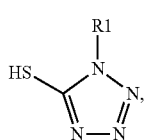

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).

CG. The method according to embodiment CD, wherein the at least one mercaptotetrazole comprises 1-phenyl-1H-tetrazole-5-thiol.

CH. The method according to embodiment CD, wherein the at least one mercaptotetrazole comprises at least one compound having the structure (II):

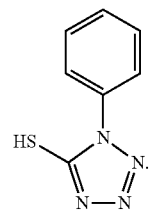

(II)

CJ. The method according to embodiment CD, wherein the at least one mercaptotriazole comprises at least one 1,2,4-mercaptotriazole.

CK. The method according to embodiment CD, wherein the at least one mercaptotriazole comprises at least one compound having the general structure (III):

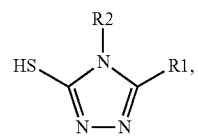

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group (SO$_2$R$_5$), a carboxylic acid group (COOH) or a salt of a carboxylic acid (CO$_2^-$M$^+$) where M$^+$ is a cation (such as a metal cation, a quaternary ammonium cation or a quaternary phosphonium cation), a carboxamide group (CONR$_3$R$_4$), an acylamino group (NR$_4$COR$_5$), an acyl group (COR$_5$), an acyloxy group (OCOR$_5$), or a sulfonamido group (SO$_2$NR$_3$R$_4$).

CL. The method according to embodiment CD, wherein the at least one mercaptotriazole comprises 4-benzyl-1,2,4-triazole-3-thiol.

CM. The method according to embodiment CD, wherein the at least one mercaptotriazole comprises at least one compound having the structure (IV):

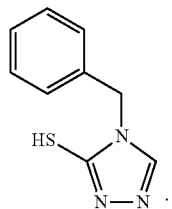

(IV)

CN. The method according to embodiment CD, wherein the at least one mercaptotriazole comprises 4-benzyl-5-hydroxymethyl-1,2,4-triazole-3-thiol.

CP. The method according to embodiment CD, wherein the at least one mercaptotriazole comprises at least one compound having the structure (V):

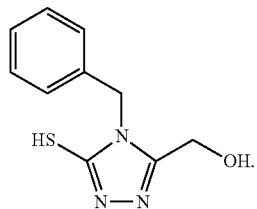

(V)

CQ. The method according to embodiment CP, wherein the applying the at least one first coating mixture and the applying the at least one second coating mixture occur simultaneously.

CR. The method according to embodiment CP, further comprising drying the at least one first layer or the at least one second layer or both.

CS. The method according to embodiment CD, wherein the said at least one at least one second coating mixture further comprises at least one mercaptotetrazole or mercaptotriazole.

CT. The method according to embodiment CS, wherein the at least one mercaptotetrazole comprises at least one compound having the general structure (I):

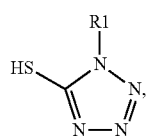

(I)

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group (NR$_2$R$_3$) where R$_2$ and R$_3$ are independently a hydrogen, an alkyl group comprising up to 20 carbon atoms, or an aryl group comprising up to 10 carbon atoms, a thioether group (SR$_4$) where R$_4$ is an alkyl group comprising up to 20 carbon atoms, or an aryl group comprising up to 10 carbon atoms, a sulfoxy group (SOR$_4$), a sulfone group (SO$_2$R$_4$), a carboxylic acid group (COOH) or a salt of a carboxylic acid (CO$_2^-$M$^+$) where M$^+$ is a cation (such as a metal cation, a quaternary ammonium cation or a quaternary phosphonium cation), a carboxamide group (CONR$_2$R$_3$), an acylamino group (NR$_2$COR$_4$), an acyl group (COR$_4$), an acyloxy group (OCOR$_4$), or a sulfonamido group (SO$_2$NR$_2$R$_3$).

CU. The method according to embodiment CS, wherein the at least one mercaptotetrazole comprises 1-phenyl-1H-tetrazole-5-thiol.

CV. The method according to embodiment CS, wherein the at least one mercaptotetrazole comprises at least one compound having the structure (II):

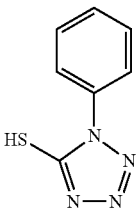

(II)

CW. The method according to embodiment CS, wherein the at least one mercaptotriazole comprises at least one 1,2,4-mercaptotriazole.

CX. The method according to embodiment CS, wherein the at least one mercaptotriazole comprises at least one compound having the general structure (III):

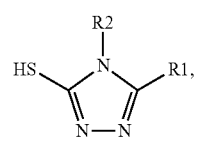

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group (NR$_3$R$_4$) where R$_3$ and R$_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group ($SOR_5$), a sulfone group ($SO_2R_5$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_3R_4$), an acylamino group ($NR_4COR_5$), an acyl group ($COR_5$), an acyloxy group ($OCOR_5$), or a sulfonamido group ($SO_2NR_3R_4$).

CY. The method according to embodiment CS, wherein the at least one mercaptotriazole comprises 4-benzyl-1,2,4-triazole-3-thiol.

CZ. The method according to embodiment CS, wherein the at least one mercaptotriazole comprises at least one compound having the structure (IV):

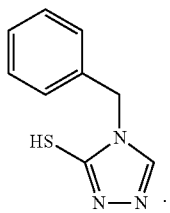

(IV)

DA. The method according to embodiment CS, wherein the at least one mercaptotriazole comprises 4-benzyl-5-hydroxymethyl-1,2,4-triazole-3-thiol.

DB. The method according to embodiment CS, wherein the at least one mercaptotriazole comprises at least one compound having the structure (V):

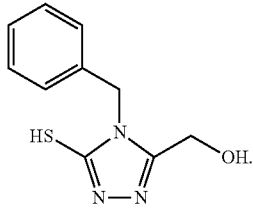

(V)

DC. The method according to embodiment DB, wherein the applying the at least one first coating mixture and the applying the at least one second coating mixture occur simultaneously.

DD. The method according to embodiment DC, further comprising drying the at least one first layer or the at least one second layer or both.

EXAMPLES

Materials and Methods

All materials used in the following examples are readily available from standard commercial sources, such as Sigma-Aldrich Chemical Co. LLC (Saint Louis) unless otherwise specified. All percentages are by weight unless otherwise indicated. The following additional methods and materials were used.

Boric acid (BA), available from Sigma-Aldrich, has the structure:

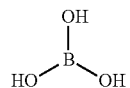

1-Phenyl-1H-tetrazole-5-thiol (PMT), also known as phenyl mercaptotetrazole, available from Sigma-Aldrich, has the structure:

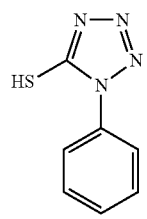 [SMILES: Sc1nnnn1-c1ccccc1]

CAB 381-20 is a cellulose acetate butyrate resin available from Eastman Chemical Co. (Kingsport, Tenn.). It has a glass transition temperature of 141° C.

CAB 553-0.4 is a cellulose acetate butyrate resin available from Eastman Chemical Co. (Kingsport, Tenn.). It has a glass transition temperature of 136° C.

CYMEL® 303 crosslinker is hexamethoxymethylmelamine, available from Cytec Industries (West Paterson, N.J.).

ESTAR® polyester substrate is available from Eastman Kodak (Rochester, N.Y.).

SR399 (dipentaerythritolpentaacrylate, Sartomer) is a clear liquid having a molecular weight of 525 g/mol.

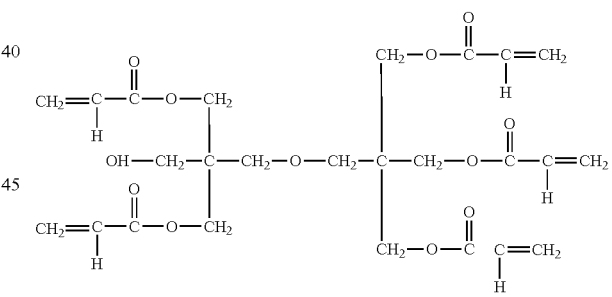

SLIP-AYD® FS 444 (polysiloxane in dipropylene glycol, Elementis) is a liquid additive for increasing surface slip and mar resistance of water borne and polar solvent borne coatings.

Mayer Bars are ½ inch diameter Type 303 stainless steel coating rods and are available from R.D. Specialties, Inc. (Webster, N.Y.).

Silver nanowires were prepared according to two procedures. For Example 1, a procedure similar to Example 13 of US patent application publication 2012/0328469A1, published Dec. 27, 2012, was followed, using a reaction temperature of 160° C. for 45 minutes. (US patent application publication 2012/0328469A1 is hereby incorporated by reference in its entirety.) Silver nanowires so prepared exhibited an average diameter of 54±29 nm, and an average length of 18±14 μm. For Example 2, silver nanowires were prepared according to procedures described in U.S. patent application Ser. No. 14/043,966, filed Oct. 2, 2013, which is hereby incorporated by reference in its entirety. The typical silver nanowires have diameters ranging from 38 nm to 44 nm and range in length from 17 to 25 µm.

XCURE® 184 photoinitiator is 1-hydroxy-cyclohexylphenyl-ketone (Dalian).

Example 1

Preparation of Silver Nanowire Coating Dispersion

A CAB polymer premix solution was prepared by mixing 10 parts by weight of CAB 381-20 (cellulose acetate butyrate polymer, Eastman Chemical) with 90 parts by weight of isopropyl acetate (>98.6% purity, Aldrich). The resulting CAB polymer premix solution was filtered prior to use. 25.43 parts by weight of the CAB polymer premix solution was combined with 16.96 parts by weight ethyl lactate (>99.8% purity), 45.82 parts by weight of a 1.85% solids dispersion of silver nanowires in isopropanol, and 11.79 parts by weight of isopropyl acetate (>98.6% purity, Aldrich) to form a silver nanowire coating dispersion at 3.39% solids.

Finished silver solutions were prepared by adding various loadings of boric acid (BA) to aliquots of the masterbatch solution, as shown in Table I. The finished silver nanowire coating dispersions were coated on a lab proofer with a 320 lines per inch (LPI) plate onto 5 mil ESTAR LS polyester support, and dried at 280° F. for 2 minutes.

Preparation of Topcoat Solution

A CAB polymer premix solution was prepared by mixing 15 parts by weight of CAB 553-0.4 (cellulose acetate butyrate polymer, Eastman Chemical) into 42.50 parts by weight of denatured ethanol and 42.50 parts by weight methanol (>99% purity). The resulting CAB polymer premix solution was filtered prior to use.

A topcoat masterbatch solution was prepared by adding to 5000 parts by weight of the CAB polymer premix solution, 4040 parts by weight denatured ethanol, 2250 parts by weight of 33 wt % CYMEL 303 (hexamethoxymethylmelamine, Cytec) in denatured ethanol, 150 parts by weight of 10 wt % SLIP-AYD FS-444 (polysiloxane in dipropylene glycol ether, Elementis) in denatured ethanol, 375 parts by weight of 20 wt % p-toluenesulfonic acid (PTSA, Fisher/Univar) in denatured ethanol and 4018 parts by weight of isopropanol (>98% purity). The topcoat masterbatch solution had 10.0% solids.

Preparation of the Coated Films

The topcoat solution was overcoated on the silver nanowire thin conducting film (AgTCF) with a lab proofer and a 450 (lines per inch) LPI plate, and dried at 280° F. for 3 minutes.

Evaluation of the Coated Films

Thin conducting film (TCF) surface resistivity, light transmission, and haze were evaluated. TCF surface resistivity was measured at 80° C. and on a lab desktop as described below.

80° C. TCF Stability Test

Surface resistivity was measured for the coatings immediately after coating (initial values) with either an RCHEK RC3175 4-point resistivity or a Delcom 707 non-contact conductance monitor. These TCF samples were then placed in a Blue-M oven with free air flow at 80° C. for 10 days. After the test period, the TCF samples were then checked again to record the change in film resistivity.

Desktop TCF Stability Test

Surface resistivity was measured for the coatings immediately after coating (initial values) with either an RCHEK RC3175 4-point resistivity meter or a Delcom 707 non-contact conductance monitor. These TCF samples were then placed on lab desktop under 1500-2000 LUX fluorescence light with the TCF side towards the light for 1 and 2 months. After the test period, the TCF samples were then checked again to record the change in film resistivity.

The stability testing results in Table I show that 80° C. and desktop stability were improved upon addition of boric acid (BA) directly to the silver nanowire coating dispersion.

TABLE I

| Sample # | BA in Ag soln. (wt %) | Ratio of Wires to BA (g/g) | Initial Surface Resistivity (ohms/sq) | Total light trans. (% T) | Haze (%) | Surface Resistivity Change 80° C. t = 10 days (% change) | Surface Resistivity Change Desktop t = 1 month (% change) | Surface Resistivity Change Desktop t = 2 months (% change) |
|---|---|---|---|---|---|---|---|---|
| Com-1-1 | none | | 67 | 88.0 | 2.95 | +481 | +12 | +15 |
| 1-1 | 0.010 | 88 | 64 | 88.0 | 2.87 | +454 | +3 | +6 |
| 1-2 | 0.038 | 22 | 65 | 87.9 | 2.88 | +254 | +16 | +21 |

Example 2

Preparation of Silver Nanowire Coating Dispersion

A CAB polymer premix solution was prepared by mixing 15 parts by weight of CAB 381-20 (cellulose acetate butyrate polymer, Eastman Chemical) with 85 parts by weight of n-propyl acetate (Oxea). The resulting CAB polymer premix solution was filtered prior to use.

15.00 parts by weight of the CAB polymer premix solution was combined with 10.00 parts by weight ethyl lactate (>99.8% purity), 40.55 parts by weight of a 1.85% solids dispersion of silver nanowires in isopropanol, and 34.44 parts by weight of n-propyl acetate (Oxea) to form a silver nanowire coating dispersion at 3.00% solids.

The finished silver nanowire coating dispersion was coated on a lab proofer with a 400 LPI plate onto 5 mil ESTAR LS polyester support, and dried at 275° F. for 2 minutes.

Preparation of Topcoat Solution

A CAB polymer premix solution was prepared by mixing 15 parts by weight of CAB 553-0.4 (cellulose acetate butyrate polymer, Eastman Chemical) into 42.50 parts by weight of denatured ethanol and 42.50 parts by weight methanol (>99% purity). The resulting CAB polymer premix solution was filtered prior to use.

A topcoat masterbatch solution was prepared by adding to 5000 parts by weight of the CAB polymer premix solution, 3585 parts by weight denatured ethanol, 10188 parts by weight of 33 wt % SR399 (dipentaerythritol pentaacrylate, Sartomer) in denatured ethanol, 660 parts by weight of 10 wt % SLIP-AYD FS-444 (polysiloxane in dipropylene glycol ether, Elementis) in denatured ethanol, 3774 parts by weight of 10 wt % XCURE 184 (Dalian) in denatured ethanol. The topcoat masterbatch solution had 19.5% solids.

Finished topcoat solutions were prepared by adding various loadings of boric acid (BA) and phenyl mercaptotetrazole (PMT) to aliquots of the masterbatch solution as shown in Table II.

Preparation of the Coated Films

The above finished topcoats were coated onto the silver nanowire thin conducting films (AgTCF) prepared as described above with a 450 LPI plate, and dried in an oven at 115° F. for 2 minutes followed by two pass UV curing with a Fusion 300 UV-H lamp at 30 ft/minute speed.

Evaluation of the Coated Films

The coated films were evaluated using the methods described in Example 1, with the exception that surface resistivity measurements were not made on the coated films in this example at 80° C. The stability testing in Table II show desktop stability was improved upon addition of phenyl mercaptotetrazole to the topcoat solution, and that the addition of boric acid (BA) gave an additional improvement in desktop stability.

The invention has been described in detail with particular reference to a presently preferred embodiment, but it will be understood that variations and modifications can be effected within the spirit and scope of the invention. The presently disclosed embodiments are therefore considered in all respects to be illustrative and not restrictive. The scope of the invention is indicated by the appended claims, and all changes that come within the meaning and range of equivalents thereof are intended to be embraced therein.

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_2R_3$) where $R_2$ and $R_3$ are independently a hydrogen, an alkyl group comprising up to 20 carbon atoms, or an aryl group comprising up to 10 carbon atoms, a thioether group ($SR_4$) where $R_4$ is an alkyl group comprising up to 20 carbon atoms, or an aryl group comprising up to 10 carbon atoms, a sulfoxy group ($SOR_4$), a sulfone group ($SO_2R_4$), a carboxylic acid group (COOH) or a salt of a carboxylic acid ($CO_2^-M^+$) where $M^+$ is a cation (such as a metal cation, a quaternary ammonium cation or a quaternary phosphonium cation), a carboxamide group ($CONR_2R_3$), an acylamino group ($NR_2COR_4$), an acyl group ($COR_4$), an acyloxy group ($OCOR_4$), or a sulfonamido group ($SO_2NR_2R_3$).

TABLE II

| Sample # | BA in Topcoat Solution (wt %) BA | PMT in Topcoat solution (wt %) PMT | Initial Surface Resistivity (ohms/sq) | Total light trans. (% T) | Haze (%) | Surface Resistivity Change Desktop t = 1 month (% change) | Surface Resistivity Change Desktop t = 2 months (% change) |
|---|---|---|---|---|---|---|---|
| Com-2-1 | none | none | 78 | 91.0 | 1.48 | +44 | +80 |
| 2-1 | none | 0.222 | 83 | 91.0 | 1.50 | +18 | +29 |
| 2-2 | none | 0.452 | 87 | 91.0 | 1.42 | +9 | +21 |
| 2-3 | 0.452 | 0.452 | 88 | 90.3 | 1.41 | 0 | +11 |

What is claimed:

1. A transparent conductive article comprising:
   a transparent support;
   at least one first layer disposed on the transparent support, the at least one first layer comprising a network of silver nanowires dispersed within at least one polymer binder; and
   boric acid.

2. The transparent conductive article according to claim 1, wherein the at least one first layer comprises boric acid.

3. The transparent conductive article according to claim 2, wherein the at least one first layer further comprises at least one mercaptotetrazole having the general structure (I):

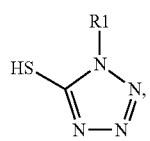

(I)

4. The transparent conductive article according to claim 2, wherein the at least one first layer further comprises least one mercaptotriazole having the general structure (III):

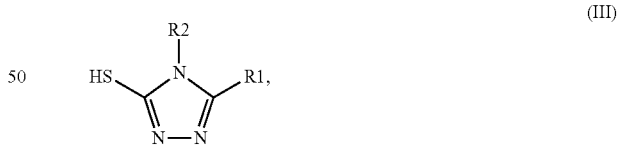

(III)

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group ($NR_3R_4$) where $R_3$ and $R_4$ are independently a hydrogen, an alkyl group comprising up to 20 carbon atoms, or an aryl group comprising up to 10 carbon atoms, a thioether group ($SR_5$) where $R_5$ is an alkyl group comprising up to 20 carbon atoms, or an aryl group comprising up to 10 carbon atoms, a sulfoxy group (SOR$_5$), a sulfone group (SO$_2$R$_5$), a carboxylic acid group (COOH) or a salt of a carboxylic acid (CO$_2^-$M$^+$) where M$^+$ is a cation (such as a metal cation, a quaternary ammonium cation or a quaternary phosphonium cation), a carboxamide group (CONR$_3$R$_4$), an acylamino group (NR$_4$COR$_5$), an acyl group (COR$_5$), an acyloxy group (OCOR$_5$), or a sulfonamido group (SO$_2$NR$_3$R$_4$).

5. The transparent conductive article according to claim 1, further comprising at least one second layer disposed adjacent to the at least one first layer, the at least one second layer comprising boric acid.

6. The transparent conductive article according to claim 5, wherein the at least one second layer is disposed on the at least one first layer.

7. The transparent conductive article according to claim 5, wherein the at least one second layer is disposed between the transparent substrate and the at least one first layer.

8. The transparent conductive article according to claim 5, wherein the at least one second layer further comprises at least one mercaptotetrazole having the general structure (I):

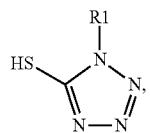

wherein R1 is one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group (NR$_2$R$_3$) where R$_2$ and R$_3$ are independently a hydrogen, an alkyl group comprising up to 20 carbon atoms, or an aryl group comprising up to 10 carbon atoms, a thioether group (SR$_4$) where R$_4$ is an alkyl group comprising up to 20 carbon atoms, or an aryl group comprising up to 10 carbon atoms, a sulfoxy group (SOR$_4$), a sulfone group (SO$_2$R$_4$), a carboxylic acid group (COOH) or a salt of a carboxylic acid (CO$_2^-$M$^+$) where M$^+$ is a cation (such as a metal cation, a quaternary ammonium cation or a quaternary phosphonium cation), a carboxamide group (CONR$_2$R$_3$), an acylamino group (NR$_2$COR$_4$), an acyl group (COR$_4$), an acyloxy group (OCOR$_4$), or a sulfonamido group (SO$_2$NR$_2$R$_3$).

9. The transparent conductive article according to claim 5, wherein the at least one first layer further comprises 1-phenyl-1H-tetrazole-5-thiol (PMT).

10. The transparent conductive article according to claim 5, wherein the at least one first layer further comprises least one mercaptotriazole having the general structure (III):

wherein R1 and R2 are independently one of a hydrogen, a substituted or unsubstituted alkyl group comprising up to 20 carbon atoms, a substituted or unsubstituted aryl group comprising up to 10 carbon atoms, a substituted or unsubstituted alkylaryl group comprising up to 30 carbon atoms, a substituted or unsubstituted heteroaryl group comprising up to 10 carbon, oxygen, nitrogen, or sulfur atoms, a halogen atom (F, Cl, Br, or I), a hydroxyl group (OH), a thiol group (SH), a substituted or unsubstituted alkoxy group comprising up to 20 carbon atoms, an amino group (NR$_3$R$_4$) where R$_3$ and R$_4$ are independently a hydrogen, an alkyl group comprising up to 20 carbon atoms, or an aryl group comprising up to 10 carbon atoms, a thioether group (SR$_5$) where R$_5$ is an alkyl group comprising up to 20 carbon atoms, or an aryl group comprising up to 10 carbon atoms, a sulfoxy group (SOR$_5$), a sulfone group (SO$_2$R$_5$), a carboxylic acid group (COOH) or a salt of a carboxylic acid (CO$_2^-$M$^+$) where M$^+$ is a cation (such as a metal cation, a quaternary ammonium cation or a quaternary phosphonium cation), a carboxamide group (CONR$_3$R$_4$), an acylamino group (NR$_4$COR$_5$), an acyl group (COR$_5$), an acyloxy group (OCOR$_5$), or a sulfonamido group (SO$_2$NR$_3$R$_4$).

11. A method comprising:
    applying at least one first coating mixture onto a transparent support to form at least one first coated layer, the at least one first coating mixture comprising boric acid, silver nanowires, and at least one polymer binder; and,
    applying at least one second coating mixture onto the at least one first coated layer.

* * * * *